United States Patent
Shimamura et al.

[11] Patent Number: 6,045,916
[45] Date of Patent: Apr. 4, 2000

[54] COATING FILM AND PREPARATION METHOD THEREOF

[75] Inventors: Eihaku Shimamura; Chiori Ito; Akira Shirakura, all of Tokyo-to, Japan

[73] Assignee: Kirin Beer Kabushiki Kaisha, Tokyo-to, Japan

[21] Appl. No.: 09/174,453

[22] Filed: Oct. 19, 1998

[51] Int. Cl.[7] .................................................. B32B 9/00
[52] U.S. Cl. .................. 428/408; 428/35.2; 428/35.4; 428/205; 428/207; 428/323; 428/409; 428/411.1; 428/458; 428/480; 427/122; 427/570; 427/577
[58] Field of Search .................... 428/207, 205, 428/323, 408, 480, 411.1, 35.2, 35.4, 409, 458; 427/570, 577, 122

[56] References Cited

U.S. PATENT DOCUMENTS

| | | | |
|---|---|---|---|
| 4,389,449 | 6/1983 | Kohle et al. | 428/203 |
| 5,171,607 | 12/1992 | Cumbo | 427/570 |
| 5,569,501 | 10/1996 | Bailey et al. | 427/577 |

FOREIGN PATENT DOCUMENTS 4-304373  10/1992  Japan .
5-320873  12/1993  Japan .

OTHER PUBLICATIONS

Japanese Patent No. 05320873, Dec. 1993 (Abstract only).
Japanese Patent No. 04304373, Oct. 1992 (Abstract only).

*Primary Examiner*—Deborah Jones
*Assistant Examiner*—Abraham Bahta
*Attorney, Agent, or Firm*—Oblon, Spivak, McClelland, Maier & Neustadt, P.C.

[57] ABSTRACT

DLC film formed on at least one surface of a plastic film, and this DLC film has a composition comprising 75 to 55 mol% of carbon and 25 to 45 mol% of hydrogen. And this DLC film is formed by a plasma deposition process while the plastic film is loaded with a tensile force in a biaxial direction.

10 Claims, 6 Drawing Sheets

FIG. 5

| EXPERIMENT NO. | MATERIAL GAS (torr) HEXANE/ARGON | COMPOSITION (mol%) CARBON/HYDROGEN | SPECIFIC GRAVITY (g/cm³) | THICKNESS OF DLC FILM (Å) |
|---|---|---|---|---|
| 1 | 0.01/0.09 | 90/10 | 2.80 | 980 |
| 2 | 0.03/0.07 | 75/25 | 2.72 | 1020 |
| 3 | 0.05/0.05 | 70/30 | 2.65 | 1100 |
| 4 | 0.07/0.03 | 65/35 | 2.45 | 1050 |
| 5 | 0.09/0.01 | 60/40 | 2.35 | 1150 |
| 6 | 0.10/0.00 | 55/45 | 2.15 | 1200 |

FIG. 6

| EXPERIMENT NO. | ADHESION 1 | ADHESION 2 (g) | ALKALI RESISTANCE |
|---|---|---|---|
| 1 | 100/100 | 16.5 | EXCELLENT |
| 2 | 100/100 | 14.5 | EXCELLENT |
| 3 | 100/100 | 13.0 | GOOD |
| 4 | 100/100 | 11.5 | GOOD |
| 5 | 100/100 | 10.0 | GOOD |
| 6 | 100/100 | 9.5 | GOOD |

ADHESION 1: number of the cells which were not peeled off / total number of the cells

FIG. 7

THE LOW-MOLECULAR ORGANIC COMPOUND ADSORPTIVITY OF EACH COATING FILM

UNIT: $10^{-3}$ μg/cm$^3$/ppm

| EXPERIMENT NO. | octanol | octanal | ethylhexanoate | d-limonene | octane |
|---|---|---|---|---|---|
| 1 | 0.0 | 2.2 | 0.6 | 1.2 | 1.7 |
| 2 | 0.0 | 0.0 | 0.0 | 0.0 | 0.0 |
| 3 | 0.0 | 0.9 | 0.0 | 0.4 | 0.4 |
| 4 | 0.0 | 0.9 | 0.8 | 1.3 | 2.7 |
| 5 | 0.4 | 1.7 | 1.2 | 2.5 | 3.1 |
| 6 | 0.6 | 2.0 | 1.5 | 2.9 | 3.6 |
| 7 | 1.1 | 3.5 | 2.6 | 5.2 | 6.3 | experiment No. 7 shows the adsorptivity of a 25 micron thick plastic film with no coating formed thereon.

FIG. 8

GAS PERMEABILITY COEFFICIENT

UNIT : $10^{-10} cm^3 (STP) \cdot cm/cm^2 \cdot sec \cdot cmHg$

| EXPERIMENT NO. | OXYGEN | CARBON DIOXIDE |
|---|---|---|
| 1 | 0. 00102  NO GOOD | 0. 00312  NO GOOD |
| 1-A | 0. 0265    (26. 0) | 0. 115    (36. 9) |
| 2 | 0. 00143  EXCELLENT | 0. 00423  EXCELLENT |
| 2-A | 0. 00152  (1. 06) | 0. 00450  (1. 06) |
| 3 | 0. 00120  EXCELLENT | 0. 00350  EXCELLENT |
| 3-A | 0. 00125  (1. 04) | 0. 00380  (1. 09) |
| 5 | 0. 00091  EXCELLENT | 0. 00260  EXCELLENT |
| 5-A | 0. 00110  (1. 21) | 0. 00272  (1. 05) |
| 6 | 0. 00078  EXCELLENT | 0. 00212  EXCELLENT |
| 6-A | 0. 00085  (1. 09) | 0. 00234  (1. 10) |
| 7 | 0. 0290 | 0. 130 |
| 7-A | 0. 0289    (1. 00) | 0. 130    (1. 00) |

Each of experiment Nos. 1-A, 2-A, 3-A, 5-A and 6-A indicates a value of the gas permeability when the 4% elongation is given to each coating film of the experiment Nos. 1, 2, 3, 5 and 6.

Numeric values within parentheses indicate the values which are obtained by dividing gas permeability coefficient of the experiment Nos. 1-A, 2-A, 3-A, 5-A and 6-A by gas permeability coefficient of the experiment Nos. 1, 2, 3, 5 and 6, respectively. The value means variability degrees of the gas barrier properties, and as the value is close to 1.00, it is indicated that variation of the gas barrier properties decrease. In a case where the value is between 1.0 and 1.5, it is judged (excellent) that the properties hardly change. In a case of between 1.5 and 2.0, it is judged (good) that the properties slightly change. In a case of 2.0 or more, it is judged (no good) that the properties vigorously change.

COATING FILM AND PREPARATION METHOD THEREOF

BACKGROUND OF THE INVENTION

1. Field of the Invention

The present invention relates to a packaging film for use in fields of foods, medicines and the like, and a preparation method thereof.

2. Description of the Related Art

In general, a film with aluminum deposited thereon is widely used in a packaging material for packaging a food, a medicine or the like which needs to be prevented from being changed in properties due to humidity or oxygen, and from adsorbing different molecules.

However, since the aluminum deposited film is made opaque by the deposited aluminum, the film cannot be used in a case where contents requires to be seen from the outside, or in other cases. The film is disadvantageously limited in applications as the packaging material.

To solve the problem, there has also been suggested, as a transparent packaging material, another packaging film in which a plastic film is coated with an inorganic oxide such as silicon dioxide, but this inorganic oxide coated film is inferior to the aluminum deposited film in gas barrier properties for preventing the permeation of humidity, oxygen and the like. Furthermore, this kind of film is not suitable for performing the recycling of the packaging material which has been advanced recently, because the packaging material is contaminated with silicon dioxide.

Moreover, in a case where either of the aluminum deposited film and the inorganic oxide coated film is elongated by tensile force during its use, its gas barrier properties are disadvantageously remarkably deteriorated.

The present invention has been developed to solve the aforementioned problems of the conventional packaging film for packaging foods, medicines and the like.

That is to say, a first object of the invention is to provide a packaging film which has transparency, can prevent the adsorption of low-molecular organic compounds (aromatic components), has superiority in adhesion, alkali resistance and gas barrier properties, can be easily recycled and is not deteriorated in gas barrier properties even if elongation occurs on the film.

Furthermore, a second object of the invention is to provide a method of preparing the packaging film which can be performed without causing wrinkles or the like on the film.

SUMMARY OF THE INVENTION

To attain the first object, in a coating film according to a first aspect of the invention, a hard carbon layer is formed on at least one surface of a plastic film.

In the coating film according to the first aspect of the invention, the hard carbon coating film at least one surface of the plastic film remarkably decreases permeability of low-molecular inorganic gases such as oxygen and carbon dioxide to the plastic film, and enhances the gas barrier properties. Furthermore, the adsorption of various low-molecular organic compounds (aromatic components) having odor can be prevented. Moreover, the hard carbon coating film is superior in adhesion and alkali resistance, and further has transparency. Therefore, even through coating, the transparency of the plastic film is not deteriorated, and there is substantially no deterioration of gas barrier properties when elongation occurs.

Consequently, the coating film according to the first aspect of the present invention is optimum for the film for packaging foods, medicines and the like. Moreover, since the composition of the hard carbon film comprises only carbon and hydrogen, recycling is easily performed.

To attain the first object, the coating film according to a second aspect of the present invention is characterized in that, in the first aspect of the invention, the composition of the hard carbon layer comprises 75 to 55 mol% of carbon and 25 to 45 mol% of hydrogen.

Since the coating film according to the second aspect of the present invention has the aforementioned composition, in the first aspect of the invention, especially the gas barrier properties, the adsorption prevention of low-molecular organic compounds, the adhesion and the alkali resistance can be enhanced. Additionally, the gas barrier properties can be prevented from being deteriorated when elongation occurs.

To attain the first object, the coating film according to a third aspect of the invention is characterized in that, in the first aspect of the invention, the composition of the hard carbon layer comprises 75 mol% of carbon and 25 mol% of hydrogen.

Since the coating film according to the third aspect of the invention has the aforementioned composition, the coating film has especially high alkali resistance. Furthermore, the adsorption of low-molecular organic compounds (aromatic components) can be completely prevented. Additionally, even when the film elongation occurs, the gas barrier properties hardly vary. Satisfactory gas barrier properties can be maintained.

To attain the above-mentioned second object, a method of preparing a coating film according to a fourth aspect of the invention is characterized in that a hard carbon layer is formed on at least one surface of a plastic film by a plasma deposition process while the plastic film is loaded with a tensile force in a biaxial direction.

In the method of preparing the coating film according to the fourth aspect of the invention, when the hard carbon layer is formed on the surface of the plastic film by the plasma deposition process, the plastic film as a coating base material is pulled in its biaxial direction to give tension thereto, and this state is kept. Subsequently, by applying electric power across a pair of electrodes disposed in such a manner that the plastic film is sandwiched therebetween to generate plasma in a vacuum chamber to which material gas is supplied, the hard carbon layer is formed on the surface of the plastic film.

When the hard carbon layer is formed on the surface of the plastic film by the plasma deposition process, according to molecular dynamics, the hard carbon layer is a set of a molecule having a tensile stress and a molecule having a compression stress. In a process of the formation of the hard carbon layer, a distribution of the tensile and compression stresses variously changes in accordance with energy or other conditions when the molecules are combined to the plastic film. Therefore, dispersion is generated in the stress distribution, and a problem is that the thin plastic film is irregularly and finely wrinkled. If the wrinkles are stretched out, the hard carbon layer is disadvantageously cracked. In the method of preparing the coating film according to the fourth aspect of the invention, however, since the base material or plastic film is loaded with the tensile force in the biaxial direction in the process of the formation of the hard carbon layer, the tensile force is balanced with the compression stress generated on the hard carbon layer in the biaxial direction of the coating film. Therefore, wrinkles are prevented from being generated in the process of the formation of the hard carbon layer.

Additionally, since the prevention of the wrinkles obviates a necessity of stretching the coating film after the hard carbon layer is formed, the formed hard carbon layer is prevented from being cracked.

To attain the second object, in a method of preparing the coating film according to a fifth aspect of the invention, in addition to the constitution according to the fourth aspect of the invention, a magnitude of a compression stress generated in a process of formation of the hard carbon layer on the plastic film is measured beforehand, and a magnitude of the tensile force loaded on the plastic film in the biaxial direction is set to be substantially equal to a measured value of the compression stress.

According to the method of preparing the coating film of the fifth aspect of the invention, in the fourth aspect of the invention, the magnitude of the tensile force loaded on the plastic film in the biaxial direction is set to be substantially equal to the pre-measured value of the compression stress generated at the time of formation of the hard carbon coating film.

Thereby, in the process of preparing the coating film, at the time of the formation of the hard carbon coating film, since the compression stress generated on the hard carbon coating film can be completely balanced with the tensile force loaded on the plastic film in the biaxial direction, the compression stress generated on the hard carbon layer completely prevents the plastic film from being finely and irregularly wrinkled.

BRIEF DESCRIPTION OF THE DRAWINGS

FIG. 5 is a table showing examples of DLC film compositions and the specific weight and film thickness of each DLC film.

FIG. 6 is a table showing the adhesion and alkali resistance of each DLC film of FIG. 5.

FIG. 7 is a table showing results of a low-molecular organic compound adsorption test of each DLC film of FIG. 5.

FIG. 8 is a table showing the gas permeability coefficient of each hard carbon film of FIG. 5 and an increase ratio of the gas permeability coefficient when elongation occurs on the film.

DETAILED DESCRIPTION OF THE PREFERRED EMBODIMENTS

The preferred embodiment of the present invention will now be explained below with reference to the drawings.

Figure 1:
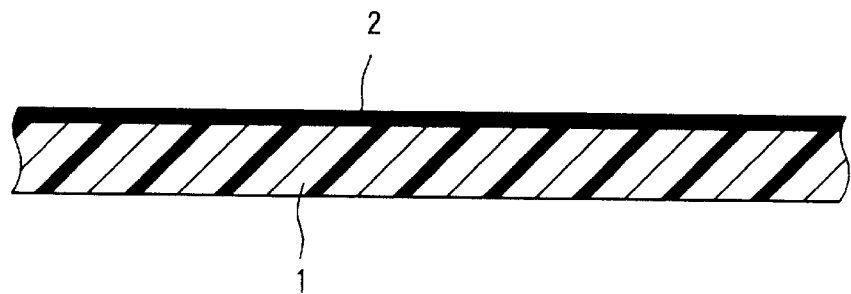
FIG. 1 is a sectional side view showing an embodiment of a coating film according to the invention.

FIG. 1 is a sectional view showing one example of a coating film according to the present invention, in which a hard carbon layer 2 comprising diamond-like carbon [hereinafter referred to as DLC (Diamond Like Carbon) film] is formed on one surface of a plastic film 1.

The hard carbon layer comprising this diamond-like carbon means an amorphous carbon film which is formed mainly by an $SP^3$ bond between carbons, which is called i carbon or hydrated amorphous carbon (a-C:H), and it is very rigid and superior in insulation and further has a very smooth morphology having a high refractive index.

Examples of a plastic material forming the plastic film 1 which is the base material include polyethylene resin, polypropylene resin, polystyrene resin, cycloolefin copolymer resin, polyethylene terephthalate resin, polyethylene naphthalate resin, ethylene-vinyl alcohol copolymer resin, poly-4-methylpentene-1 resin, polymethyl methacrylate resin, acrylonitrile resin, polyvinyl chloride resin, polyvinylidene chloride resin, acrylonitrile-styrene resin, acrylonitrile-butadiene-styrene resin, polyamide resin, polyamide-imide resin, polyacetal resin, polycarbonate resin, polybutylene terephthalate resin, ionomer resin, polysulfone resin and ethylene tetrafluoride resin.

As a coating method for forming a DLC film 2 on the surface of the plastic film 1, a pressure-reducing plasma deposition process can be exemplified.

In the pressure-reducing plasma deposition process, between a pair of electrodes disposed opposite to each other in a vacuum chamber, one electrode being connected to a high-frequency power source and the other being grounded, a plastic film as a coating base material is disposed. After the vacuum chamber is made vacuum and material gas is supplied, electric power is supplied to the one electrode from the high-frequency power source to generate plasma between the pair of electrodes. The material gas of carbon present in the plasma is ionized, and allowed to collide against the surface of the plastic film. Subsequently, when adjoining carbon ions colliding against the surface of the plastic film are combined with each other, a hard carbon film constituted of a remarkably dense DLC is formed on the surface of the plastic film.

The material gas for use is selected from an aliphatic hydrocarbon group, an aromatic hydrocarbon group, an oxygen-containing hydrocarbon group, a nitrogen-containing hydrocarbon group or the like which is gasified or liquefied at a normal temperature. Especially, as this material gas, benzene, toluene, o-xylene, m-xylene, p-xylene, cyclohexane or the like which has a carbon number of six or more is preferable.

The material may be used singly, or the mixture of two or more types of gas may be used. Furthermore, these gasses may be diluted with rare gases such as argon and helium for use. [0031] The DLC film formed in the method described above can not only remarkably decrease the permeability of the film to low-molecular inorganic gases such as oxygen and carbon dioxide but also prevent the adsorption of various low-molecular organic compounds having odor. Moreover, the transparency of the film is maintained after the DLC film is formed.

Additionally, the film thickness and quality of DLC film depend on a high-frequency output, a material gas pressure in a vacuum chamber, a supply gas flow rate, a plasma generation time, a self bias generated on the electrodes, a material gas type and the like. An increase of the high-frequency output, a decrease of the material gas pressure in the vacuum chamber, a decrease of the supply gas flow rate, an increase of the self bias, a decrease of a material carbon number and the like has large influences on the hardening of DLC film, the enhancement of denseness, the increase of compression stress and the brittleness.

Moreover, to further enhance the adhesion of the DLC film and the plastic film, prior to formation of the DLC film, plasma treatment is preferably performed with inorganic gas such as argon, oxygen and the like to activate the surface of the plastic film.

When the DLC film is formed on the thin plastic film by the pressure-reducing plasma deposition process, the plastic film as the base material disposed between the pair of electrodes in the vacuum chamber is loaded in the biaxial direction with the tensile force corresponding to the compression stress generated on the DLC film during the formation on the plastic film, while plasma deposition is performed.

Figure 2:
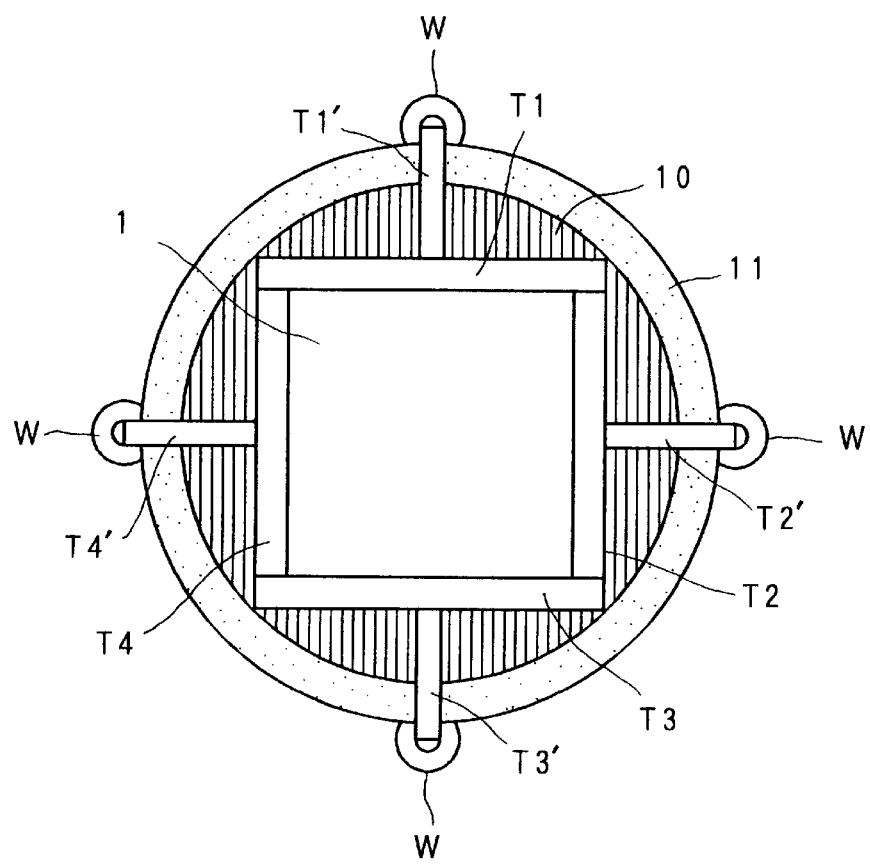
FIG. 2 is a plan view showing an embodiment of a method of preparing the coating film according to the invention.
Figure 3:
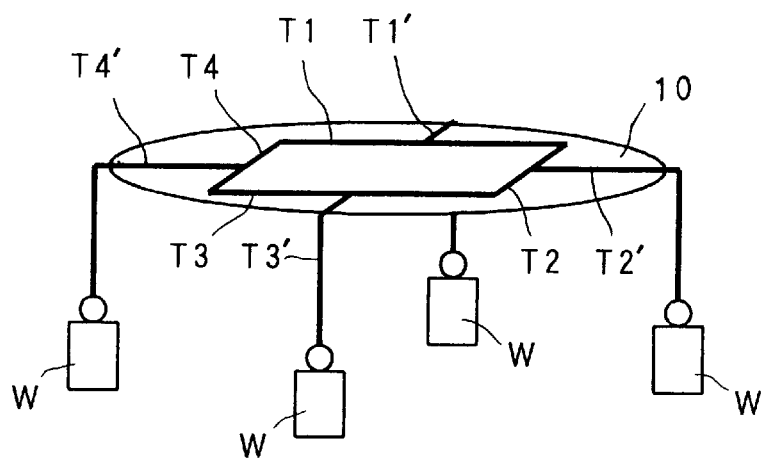
FIG. 3 is a diagrammatic perspective view showing the method of preparing the coating film.

FIGS. 2 and 3 show an example of a method for loading the plastic film to be plasma-deposited with the tensile force in the biaxial direction as aforementioned, in which heat-resistant tapes T1 to T4 having rigidity are placed on four sides of the square plastic film 1 along edges of the film which is a base material disposed on a cathode electrode 10 in the vacuum chamber. Each of heat resistant tapes T1' to T4' has one end connected to a central portion of each of the heat-resistant tapes T1 to T4.

Each of the heat-resistant tapes T1' to T4' is disposed extending to the outside perpendicularly relative to each of the heat-resistant tapes T1 to T4, and the other end thereof hangs downward from an edge of an insulating plate 11 supporting the cathode electrode 10. A required load is applied downward perpendicularly to the hanging-down or other end of each of the heat-resistant tapes T1' to T4'.

The load can be applied to each of the heat-resistant tapes T1' to T4' by interconnecting a spring, suspending a weight W as shown or otherwise. By making a spring tensile force variable or replacing the weight W, the magnitude of the load can be set optionally.

Figure 4:
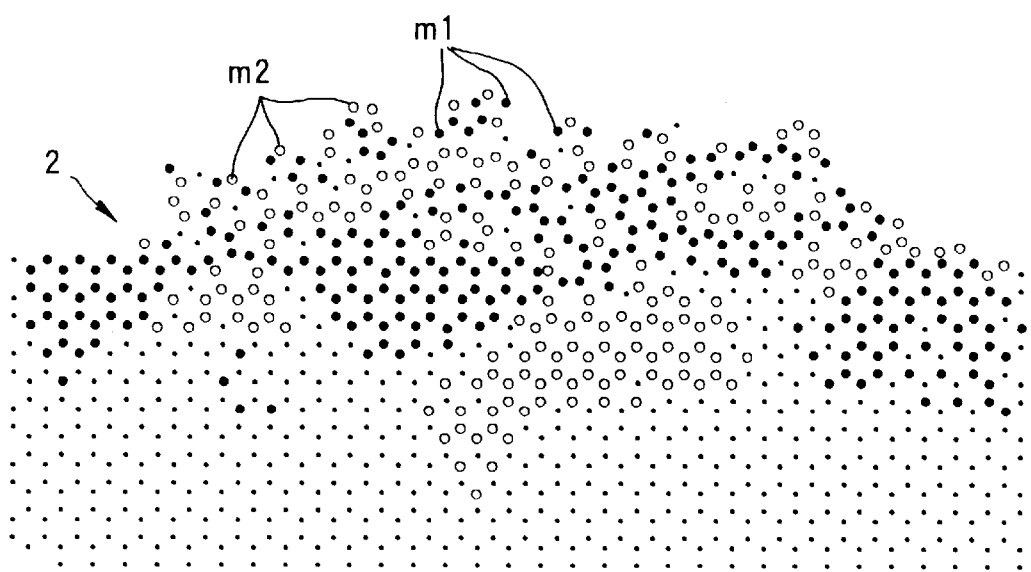
FIG. 4 is an explanatory view showing a state of formation of an DLC film in a plasma deposition process.

In this manner, the DLC film is formed while the plastic film 1 is loaded with the tensile force in the biaxial direction. Specifically, as shown in FIG. 4, according to molecular dynamics, the DLC film formed by the plasma deposition process is a combination of a molecule m1 having a compression stress to a molecule m2 having a tensile stress. In a process of formation of the DLC film, a distribution of the compression and tensile stresses of the molecules m1 and m2 variously changes in accordance with energy state or conditions in the vacuum chamber when the molecules are accelerated and combined to the base material or plastic film 1. Therefore, in a case of the DLC film is formed on the plastic film 1 in an unloaded state, a dispersion of the stress distribution in the DLC film being formed causes the plastic film 1 to be irregularly and finely wrinkled.

Subsequently, after the formation of the DLC film, if the wrinkles formed on the DLC film are stretched out, the DLC film is disadvantageously cracked, and its gas barrier properties and the like are deteriorated.

As aforementioned, by applying the tensile force to the plastic film 1 in the process of the formation of the DLC film and balancing the tensile force with the compression stress generated on the DLC film, irregular and fine wrinkles are prevented from being generated on the plastic film 1.

Additionally, when the formation of the DLC film is completed, two types of stresses of the molecules m1 and m2 are synthesized to eliminate the dispersion in the stress distribution. Therefore, no fine wrinkles are generated on the plastic film 1.

In the process of the formation of the DLC film, the tensile force loaded onto the plastic film 1 is set by forming a DLC film in the same thickness as the DLC film formed on the plastic film 1 onto one surface of a base which has a sufficient thickness with no wrinkles formed thereon in an unloaded state by the plasma deposition process, and by obtaining a compression stress generated on the DLC film beforehand.

Specifically, when the DLC film is formed on the base having a predetermined thickness in the unloaded state, the base is curled by the compression stress generated on the DLC film. Therefore, by measuring a curvature radius of the curled base and calculating the compression stress generated on the DLC film from the following formula, the tensile force is set to be equal in magnitude to the calculated compression stress.

$S = \{E_s \cdot D^2 / 6(1 - v_s)\} \cdot (1/R)$

S: compression stress
Es: Young's modulus of the base
vs: Poisson's ratio of the base
D: thickness of the base
R: curvature radius of the base curled by the formation of the DLC film In the pressure-reducing plasma deposition process, by setting the high-frequency output to 13.56 MHz and applying 0.1 torr of mixture steam of hexane and argon into the vacuum chamber to evaluate the film deposited on the plastic film 1 in Raman spectroscopy, the film formed on the surface of the plastic film 1 can be identified as the DLC film.

For the coating film with the DLC film formed thereon by changing the composition of the material gas on the conditions described above, FIG. 5 shows measured values of the density (specific gravity) and film thickness of the DLC film.

FIG. 6 shows the adhesion and alkali resistance of each coating film of FIG. 5. In FIG. 6, adhesion 1 indicates the number of cells in which no peeling occurs among one hundred cells drawn on the coating film.

FIG. 7 shows the low-molecular organic compound (aromatic component) adsorptivity (property of adsorption) of each coating film of FIG. 5. In FIG. 7, experiment No. 7 shows the adsorptivity of a 25 micron thick plastic film with no coating formed thereon.

For each coating film of FIG. 5, FIG. 8 shows a gas permeability coefficient (gas barrier properties) and an increase ratio of the gas permeability coefficient when a 4% elongation is given to each film.

In FIG. 8, each of experiment Nos. 1-A to 7-A indicates a value of the gas permeability when the 4% elongation is given to each coating film of the experiment Nos. 1 to 7. A numeric value within parentheses indicates the increase ratio of the gas permeability coefficient (variability degree of the gas barrier properties), that is, a value which is obtained by dividing the gas permeability coefficient when elongation occurs by the gas permeability coefficient when no elongation occurs.

As the value is close to 1.00, it is indicated that variation of the gas barrier properties decrease. In a case where the value is between 1.0 and 1.5, it is judged (excellent) that the properties hardly change. In a case of between 1.5 and 2.0, it is judged (good) that the properties slightly change. In a case of 2.0 or more, it is judged (no good) that the properties vigorously change.

The evaluations shown in the figures described above are performed in the following methods:

(1) The molar composition ratio of carbon and hydrogen constituting the DLC film, which is shown in FIG. 5, was measured by an RBS measurement process and an ERDA measurement process (a process of J. Crank, "The Mathematics of Diffusion", Claredon Press (1956)).

(2) DLC Film Thickness (shown in FIG. 5):
   After masking the surface of the plastic film with magic ink or the like and coating the surface with DLC, the mask was removed with diethyl ether or the like, and the film thickness was measured with a surface configuration measuring instrument DECTACK3 manufactured by Vecco Co.

(3) DLC Density (shown in FIG. 5):

A difference of weight before the film formation from after the film formation was measured, and the density was calculated from the film thickness obtained in (2).

(4) Adhesion 1 (shown in FIG. 6):

The coated surface of the plastic film was evaluated according to a cross-cut adhesion test method of JIS K5400 on the following conditions:
scratch clearance interval: 1 mm
the number of cells: 100

(5) Adhesion 2 (shown in FIG. 6):

A side wall of a container was evaluated by using a continuous load applying scratch test machine HEIDON 22 manufactured by Shinto Kagaku on the following conditions. The degree of adhesion was represented by a normal load applied to a scratching needle when the film starts peeling off.
Material, configuration of the scratching needle: diamond, 50 $\mu$R
Load applying rate: 100 g/min
Table rate: 1000 mm/min (6) Alkali Resistance (shown in FIG. 6):

A film with one surface coated with DLC was placed in an alkali solution with 10 wt% of sodium hydroxide applied thereto and dipped in a hot water bath of 75° C. for 24 hours, so that a change of the DLC configuration and the presence of peeling were confirmed. For results, no change after the dipping for 24 or more hours was displayed as excellent, and no change after the dipping for 12 or more hours was displayed as good.

(7) Low-molecular Organic Compound (Aromatic Component) Adsorptivity (shown in FIG. 7):

The low-molecular organic compound (aromatic component) having odor was used as one type of environmental material, and a test was conducted by referring to a method of Matsui et al. (J. Agric. Food. Chem., 1992, 40, 1920–1905).

The procedure is as follows:

A 0.3% sugar ester solution with 100 ppm of each of various aromatic components (octane, octanal, octanol, ethylhexanoate, d-limonene) applied thereto is prepared to form a model flavor solution.

A sample with both surfaces coated with DLC is placed in 50 ml of the model flavor solution, covered with a lid, and stored at 20° C. for one month.

After one month, the model flavor solution is discarded, and the sample is cleaned with distilled water of 60° C. and dried.

The sample is placed in 50 ml of diethyl ether, and an aromatic component adsorbed by the sample is extracted.

The sample is taken out of the diethyl ether and dehydrated by applying sodium sulfate anhydride thereto.

Amyl benzene is used as an internal standard to conduct a quantitative analysis by gas chromatograph. For results, the amount of the aromatic component adsorbed by the film is displayed in $\mu$g when the film is dipped in an aqueous solution in which 1 ppm of aromatic component exists. Therefore, a unit $\mu$g/ppm/cm$^3$ is used.

(8) An oxygen gas permeability coefficient and a carbon dioxide gas permeability coefficient, which are shown in FIG. 8, were measured by using a high-vacuum gas permeability measuring device.

As seen from the results of FIG. 6, the coating films of experiment Nos. 1 to 6 have no problem about DLC adhesion and alkali resistance. Especially, the coating film of experiment No. 1 (containing 90 mol% of carbon and 10 mol% of hydrogen) and the coating film of experiment No. 2 (containing 75 mol% of carbon and 25 mol% of hydrogen) are superior in alkali resistance.

As seen from the results of FIG. 7, for the low-molecular organic compound (aromatic component) adsorptivity, the coating films of experiment Nos. 1 to 6 are remarkably superior to the film without being coated of experiment No. 7. Especially, the coating film of experiment No. 2 (containing 75 mol% of carbon and 25 mol% of hydrogen) has no adsorptivity.

Furthermore, as seen from FIG. 8, in a case where elongation occurs, the gas barrier properties of the coating film of experiment No. 1 are remarkably lowered, but the gas barrier properties of the coating films of experiment Nos. 2 to 6 are hardly deteriorated even if elongation occurs.

The aforementioned results show that the coating films of experiment Nos. 2 to 6 (containing 75 to 55 mol% of carbon and 25 to 45 mol% of hydrogen) are low in low-molecular organic compound (aromatic component) adsorptivity, and superior in adhesion, alkali resistance and gas barrier properties. Furthermore, when elongation occurs, the gas barrier properties are hardly deteriorated. Therefore, it is clarified that the coating films are suitable for packaging food, medicine and the like.

Especially, since the coating film of experiment No. 2 (containing 75 mol% of carbon and 25 mol% of hydrogen) has no adsorptivity, it can be said to be most suitable for packaging food, medicine and the like.

Consequently, the coating film with DLC film formed thereon is not deteriorated in transparency. Furthermore, since its components are carbon and hydrogen, there is no obstruction to the recycling of packaging materials.

What is claimed is:

1. A coating film wherein a hard carbon layer comprising diamond-like carbon is formed on at least one surface of a plastic film, wherein said hard carbon layer is formed by a plasma deposition process while the plastic film is loaded with tensile force in a biaxial direction.

2. The coating film according to claim 1 wherein a composition of said hard carbon layer comprises 75 to 55 mol% of carbon and 25 to 45 mol% of hydrogen.

3. The coating film according to claim 1 wherein a composition of said hard carbon layer comprises 75 mol% of carbon and 25 mol% of hydrogen.

4. A method of preparing a coating film wherein a hard carbon layer is formed on at least one surface of a plastic film by a plasma deposition process while the plastic film is loaded with tensile force in a biaxial direction.

5. The method of preparing the coating film according to claim 4 wherein a magnitude of a compression stress generated in the formation process of the hard carbon layer on the plastic film is measured beforehand, and a magnitude of the tensile force loaded on said plastic film in the biaxial direction is set so as to be substantially equal to a measured value of the compression stress.

6. The coating film according to claim 1 wherein the plastic film is made from a base material selected from the group consisting of polyethylene resin, polypropylene resin, polystyrene resin, cycloolefin copolymer resin, polyethylene terephthalate resin, polyethylene naphthalate resin, ethylene-vinyl alcohol copolymer resin, poly-4-methylpentene-1 resin, polymethyl methacrylate resin, acrylonitrile resin, polyvinyl chloride resin, polyvinylidene chloride resin, acrylonitrile-styrene resin, acrylonitrile-butadiene-styrene resin, polyamide resin, polyamide-imide resin, polyacetal resin, polycarbonate resin, polybutylene terephthalate resin, ionomer resin, polysulfone resin and ethylene tetrafluoride resin.

7. A coating film wherein a hard carbon layer comprising diamond-like carbon is formed on at least one surface of a plastic film, wherein said hard carbon layer comprises 75 to 55 mol% of carbon and 25 to 45 mol% of hydrogen.

8. A coating film wherein a hard carbon layer comprising diamond-like carbon is formed on at least one surface of a plastic film, wherein said hard carbon layer comprises 75 mol% of carbon and 25 mol% of hydrogen.

9. A coating film wherein a hard carbon layer comprising diamond-like carbon is formed on at least one surface of a plastic film, wherein the value obtained by dividing the oxygen gas permeability coefficient of the coating film to which an elongation of 4% is applied by the oxygen gas permeability coefficient of the coating film to which no elongation is applied is not larger than 1.21.

10. A coating film wherein a hard carbon layer comprising diamond-like carbon is formed on at least one surface of a plastic film, wherein the value obtained by dividing the carbon dioxide gas permeability coefficient of the coating film to which an elongation of 4% is applied by the carbon dioxide gas permeability coefficient of the coating film to which no elongation is applied is not larger than 1.10.

* * * * *